United States Patent

(12) United States Patent
Park et al.

(10) Patent No.: US 12,329,000 B2
(45) Date of Patent: Jun. 10, 2025

(54) TRANSPARENT DISPLAY DEVICE

(71) Applicant: LG Display Co., Ltd., Seoul (KR)

(72) Inventors: Sunghee Park, Paju-si (KR); Binn Kim, Paju-si (KR); Joonsoo Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 628 days.

(21) Appl. No.: 17/550,579

(22) Filed: Dec. 14, 2021

(65) Prior Publication Data

US 2022/0190096 A1 Jun. 16, 2022

(30) Foreign Application Priority Data

Dec. 15, 2020 (KR) ........................ 10-2020-0175469

(51) Int. Cl.
*H10K 59/35* (2023.01)
*G09G 3/00* (2006.01)
*H10K 59/131* (2023.01)

(52) U.S. Cl.
CPC ........... *H10K 59/131* (2023.02); *G09G 3/006* (2013.01); *H10K 59/351* (2023.02); *H10K 59/353* (2023.02)

(58) Field of Classification Search
CPC ...... H10K 59/12; H10K 59/35; H10K 59/121; H10K 59/123; H10K 59/131; H10K 59/351; H10K 59/353; H10K 59/1213; H10K 50/86; H10K 50/865; H10K 71/00; H10K 71/861; G09G 3/00; G09G 3/006; G09G 3/3225; G09G 3/3233; G09G 2310/0297; G09G 2330/08; G09G 2300/0861; G09G 2300/0842; G09G 2300/0819; G09G 2300/0426
USPC ........................................................... 257/40
See application file for complete search history.

(56) References Cited

U.S. PATENT DOCUMENTS 9,892,672 B2 2/2018 Lee et al.
11,049,925 B2 6/2021 Kim et al.
2020/0083312 A1* 3/2020 Kim ...................... H10K 59/35

FOREIGN PATENT DOCUMENTS

KR 10-2016-0128490 A 11/2016
KR 10-2020-0029226 A 3/2020

* cited by examiner

*Primary Examiner* — Chuong A Luu
(74) *Attorney, Agent, or Firm* — SEED IP LAW GROUP LLP

(57) ABSTRACT

A transparent display device may reduce or minimize deterioration of light transmittance, which is caused by a repair line. The transparent display device comprises a first repair line extended in a first direction along a first side of a first transmissive area, a second repair line extended in a second direction along a second side of a second transmissive area disposed to be adjacent to the first transmissive area, a third repair line extended in the first direction along a third side facing the first side of the first transmissive area, and a fourth repair line extended in the second direction along a fourth side facing the second side of the second transmissive area.

10 Claims, 9 Drawing Sheets

FIG. 11

| SL1 | SL2 ||
| --- | --- | --- |
|  | M | M+1 |
| N | P1 : Row (n), Col (m-1)<br>P2 : Row (n+1), Col (m)<br>P3 : Row (n), Col (m+1)<br>P4 : Row (n-1), Col (m) | P1 : Row (n), Col (m+1)<br>P2 : Row (n-1), Col (m)<br>P3 : Row (n), Col (m-1)<br>P4 : Row (n+1), Col (m) |
| N+1 | P1 : Row (n), Col (m+1)<br>P2 : Row (n-1), Col (m)<br>P3 : Row (n), Col (m-1)<br>P4 : Row (n+1), Col (m) | P1 : Row (n), Col (m-1)<br>P2 : Row (n+1), Col (m)<br>P3 : Row (n), Col (m+1)<br>P4 : Row (n-1), Col (m) |

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit light, and a non-transmissive area. The transparent display device may have high light transmittance in the display area through the transmissive area.

BRIEF SUMMARY

The inventors of the present disclosure have recognized that when a defective subpixel occurs, a Weighted Data for Redundancy (WDR) technique for normally operating the defective subpixel using a repair line may be applied to a transparent display device in the related art. However, the inventors have appreciated that in the transparent display device to which the WDR technique is applied, a size of a transmissive area may be reduced by the repair line, whereby light transmittance may be deteriorated.

One or more embodiments of the present disclosure have been proposed in view of the various technical problems in the related art as well as the one identified above. Further, one or more embodiments of the present disclosure provide a transparent display device that may reduce or minimize deterioration of light transmittance, which is caused by a repair line.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a first repair line extended in a first direction along a first side of a first transmissive area, a second repair line extended in a second direction along a second side of a second transmissive area disposed to be adjacent to the first transmissive area, a third repair line extended in the first direction along a third side facing the first side of the first transmissive area, and a fourth repair line extended in the second direction along a fourth side facing the second side of the second transmissive area.

In accordance with another aspect of the present disclosure, the above and other technical benefits can be accomplished by the provision of a transparent display device comprising a substrate provided with transmissive areas and a non-transmissive area disposed between the transmissive areas, a plurality of first signal lines extended from the non-transmissive area in a first direction, a plurality of second signal lines extended from the non-transmissive area in a second direction, a plurality of first subpixels disposed along the second signal line, a plurality of second subpixels disposed along the first signal line, a first repair line for connecting a first subpixel in which a defect occurs with a first subpixel disposed to be adjacent to the first subpixel having a defect in the first direction, and a second repair line for connecting a second subpixel in which a defect occurs with a second subpixel disposed to be adjacent to the second subpixel having a defect in the second direction.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which:

FIG. 11 is a view illustrating an algorithm for a signal applied to a subpixel in which a defect occurs after a repair process.

DETAILED DESCRIPTION

Figure 1:
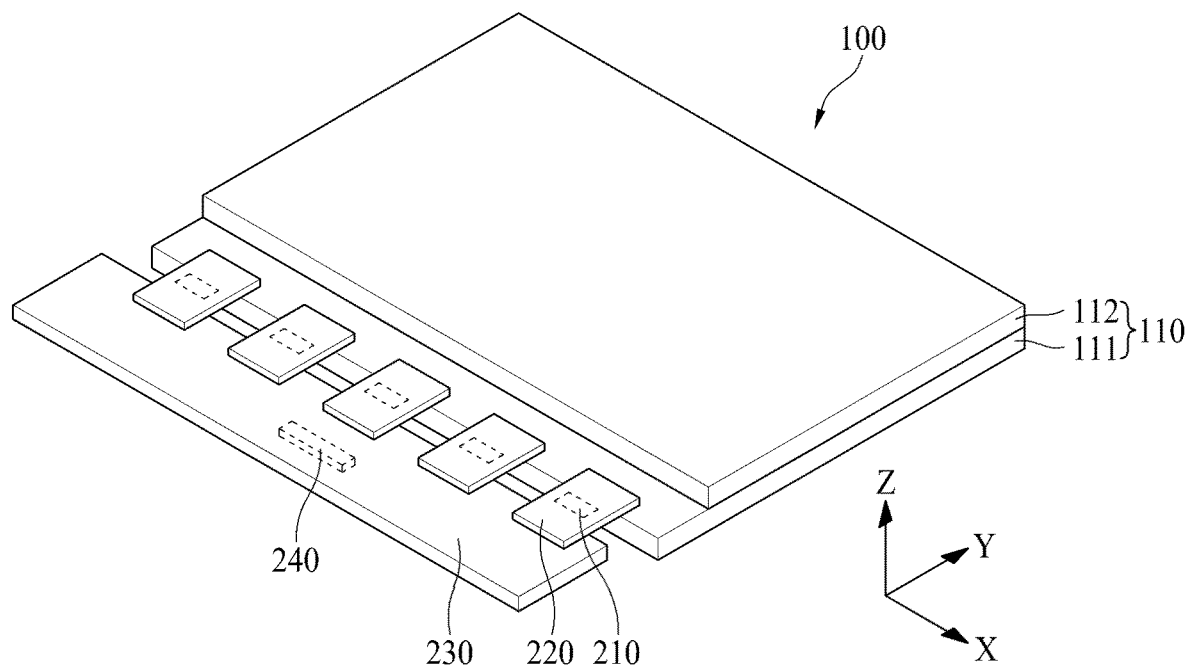
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
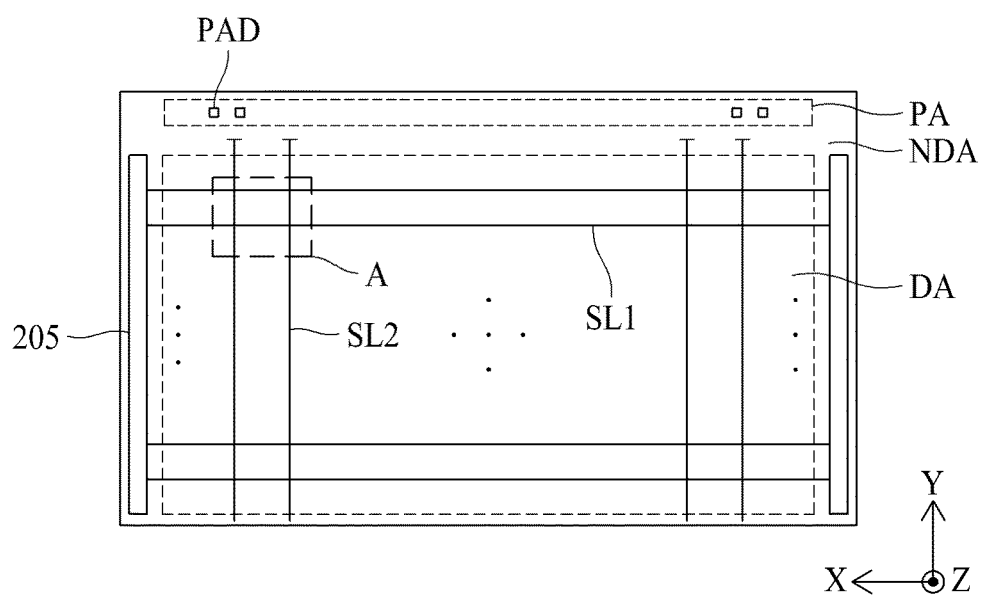
FIG. 2 is a schematic plane view illustrating a transparent display panel according to one embodiment of the present disclosure.
Figure 3:
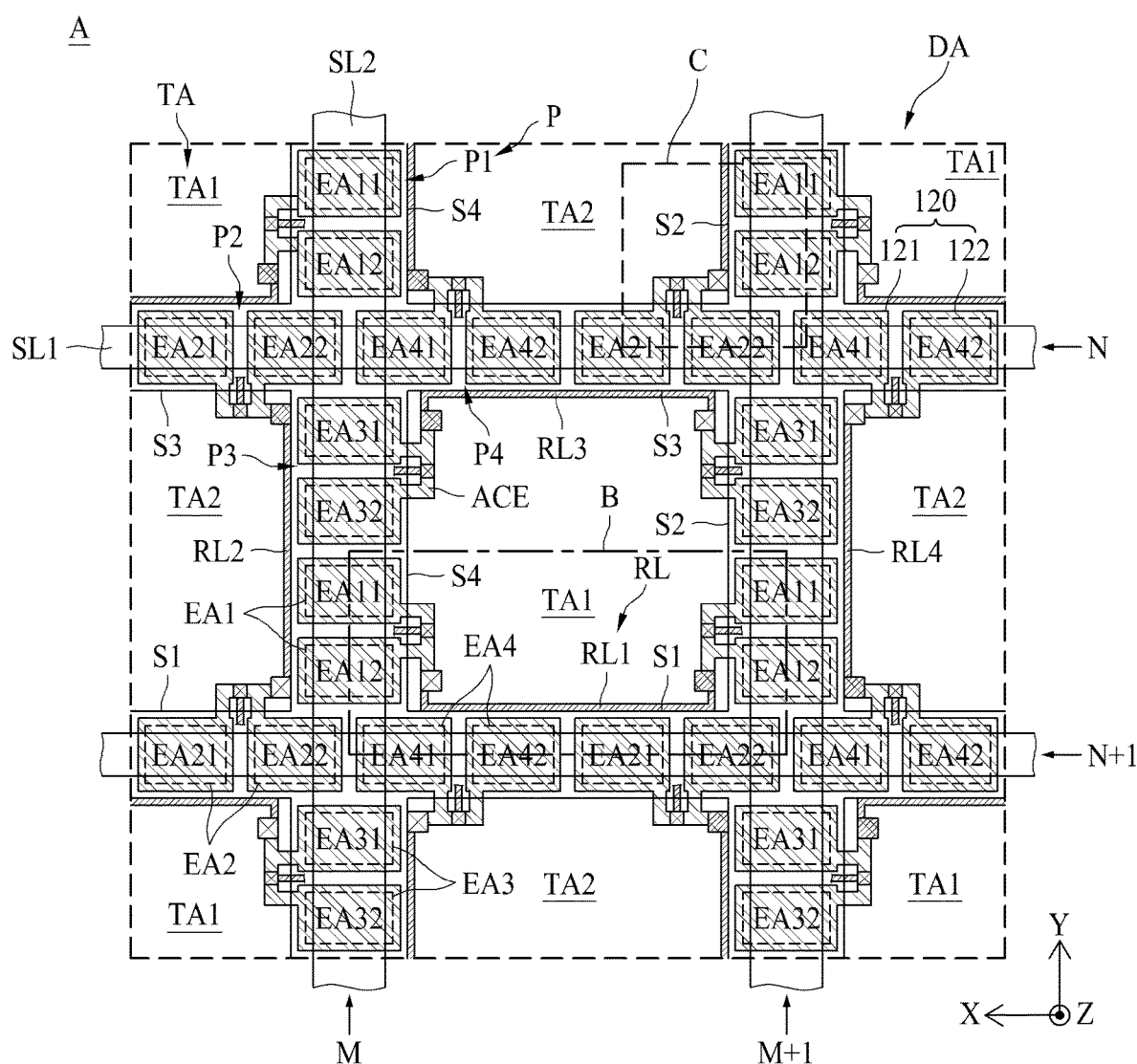
FIG. 3 is an enlarged view illustrating an area A of FIG. 2.
Figure 4:
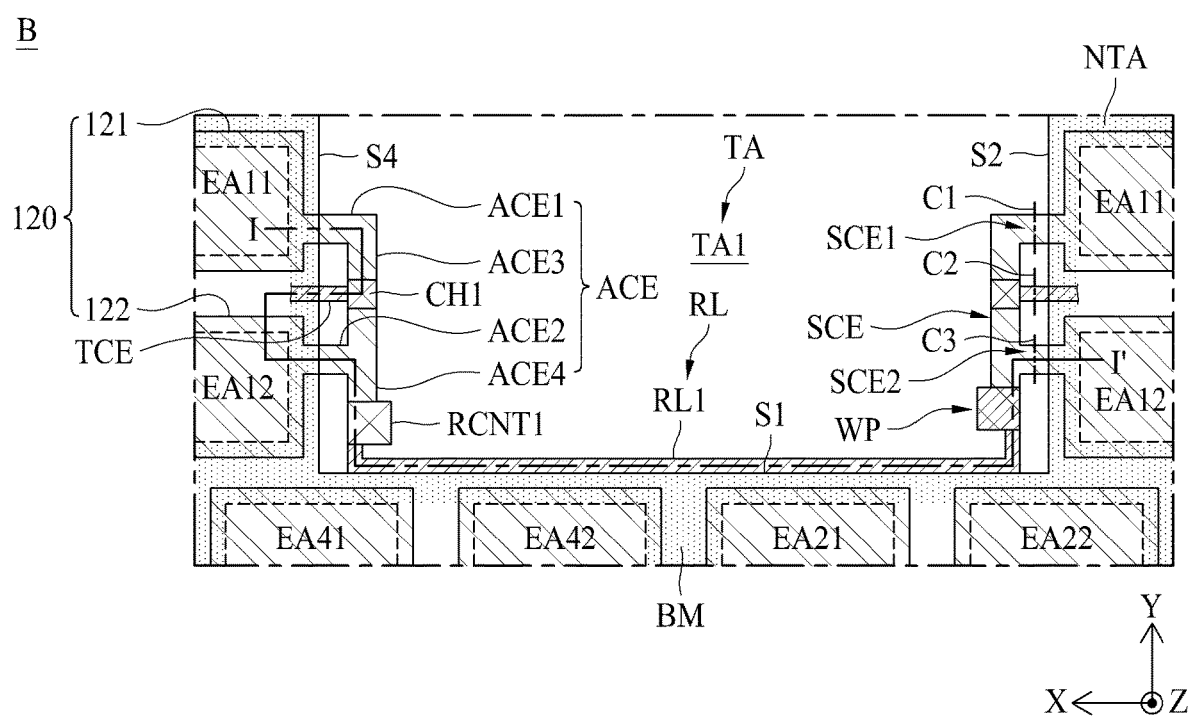
FIG. 4 is an enlarged view illustrating an area B of FIG. 3.
Figure 5:
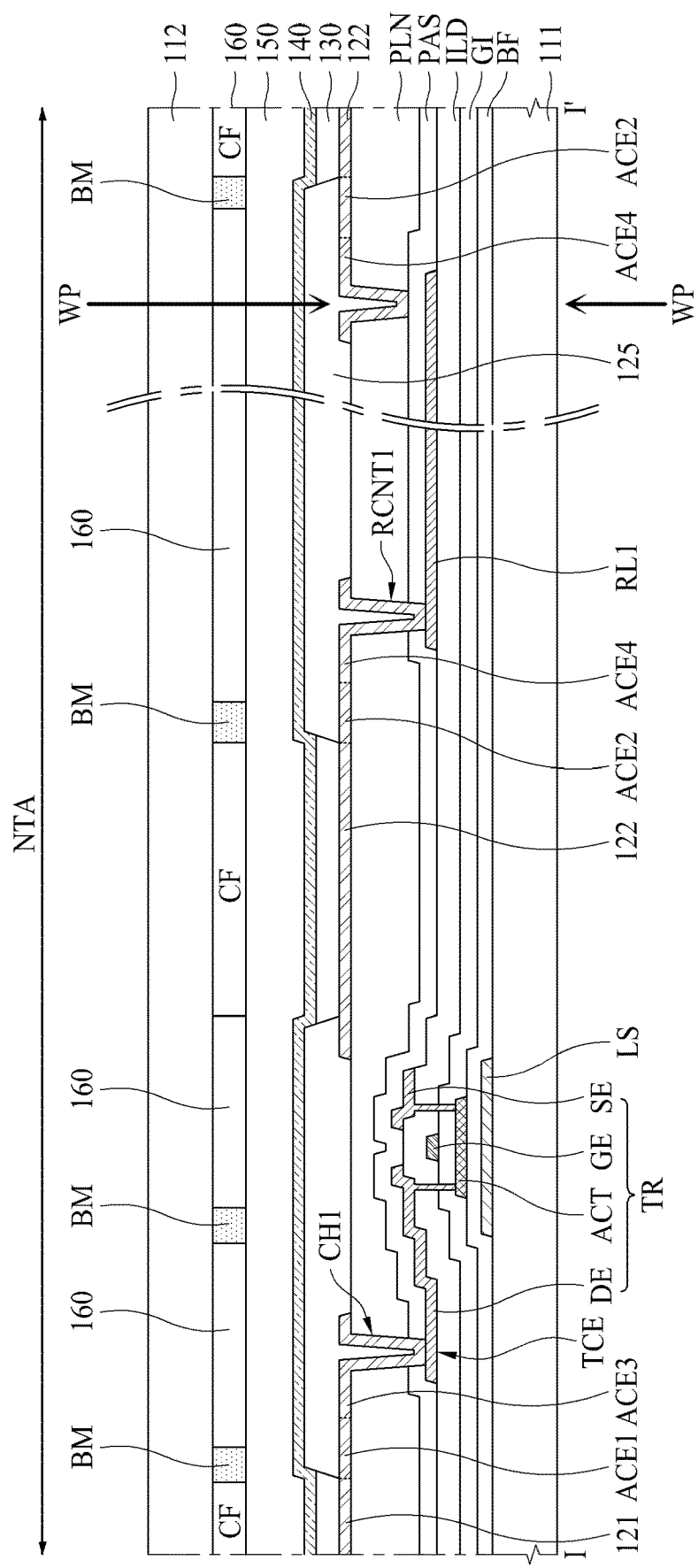
FIG. 5 is a cross-sectional view taken along line I-I' of FIG. 4.

FIG. 2 is a schematic plane view illustrating a transparent display panel according to one embodiment of the present disclosure, and FIG. 3 is an enlarged view illustrating an area A of FIG. 2. FIG. 4 is an enlarged view illustrating an area B of FIG. 3, FIG. 5 is a cross-sectional view taken along line I-I' of FIG. 4, and FIG. 6 is a cross-sectional view illustrating a repair process of connecting a defective subpixel with a subpixel disposed to be adjacent thereto.

Figure 6:
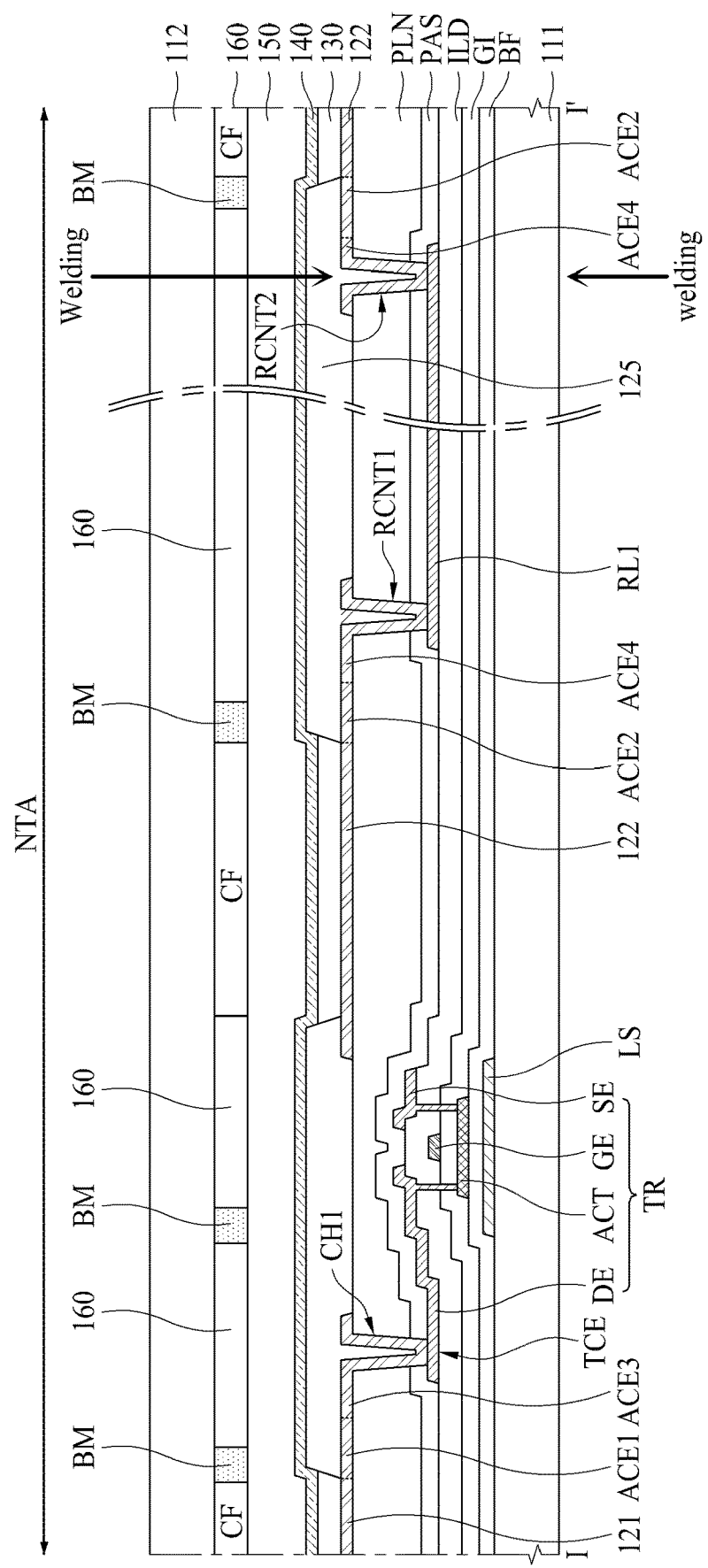
FIG. 6 is a cross-sectional view illustrating a repair process of connecting a defective subpixel with a subpixel disposed to be adjacent thereto.

Referring to FIG. 2 and FIG. 6, the first substrate 111 may include into a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SL and supplies scan signals to the scan lines SL. The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be provided in both side of the display area DA of the transparent display panel 110, but these scan drivers are not limited thereto. The scan driver 205 may be provided only in one side of the display area DA of the transparent display panel 110.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, a is greater than β. A user may view an object or background arranged over a rear surface of the transparent display panel 110 due to the transmittance of the transmissive area TA.

The non-transmissive area NTA may include a plurality of pixels P, and a plurality of first signal lines SL1 and a plurality of second signal lines SL2 to supply signals to each of a plurality of pixels P.

The plurality of first signal lines SL1 may be extended from the non-transmissive area NTA in a first direction (e.g., X-axis direction). Each of the plurality of first signal lines SL1 may include a plurality of signal lines, and, for example, may include at least one scan line.

Figure 9:
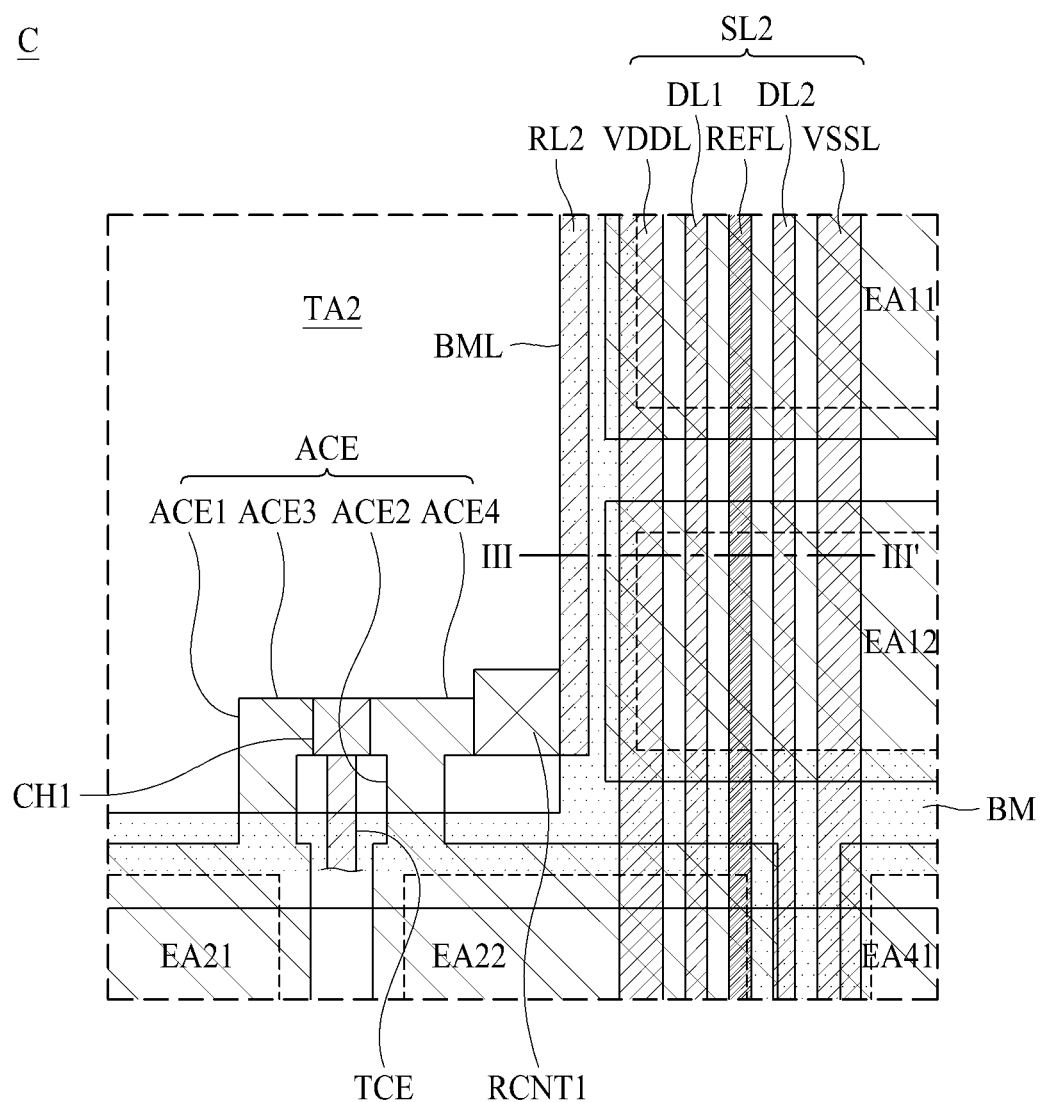
FIG. 9 is an enlarged view illustrating a modified example in an area C of FIG. 3.

The plurality of second signal lines SL2 may be extended from the non-transmissive area NTA in a second direction (e.g., Y-axis direction). The plurality of second signal lines SL2 may cross the plurality of first signal lines SL1. Each of the plurality of second signal lines SL2 may include a plurality of signal lines, and, for example, may include at least one of a first data line, a reference line, a pixel power line, a common power line, or a second data line. For simplicity of illustration purposes, the first signal lines SL1 and the second signal lines SL2 have been shown as grouped signal lines indicated as a block. FIG. 9 shows a detailed illustration of the plurality of second signal lines SL2 as an example.

A transmissive area TA may be disposed between the first signal lines SL1 adjacent to each other. In addition, the transmissive area TA may be disposed between the second signal lines SL2 adjacent to each other. That is, in one embodiment, the transmissive area TA may be surrounded by two first signal lines SL1 and two second signal lines SL2.

Pixels P may be provided to overlap at least one of the first signal line SL1 and the second signal line SL2, thereby emitting selected or predetermined light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a white color. The second subpixel P2 may include a second emission area EA2 emitting light of a green color. The third subpixel P3 may include a third emission area EA3 emitting light of a blue color. The fourth subpixel P4 may include a fourth emission area EA4 emitting light of a red color. However, the emission areas are not limited to this example. Each of the pixels P may further include a subpixel emitting light of a color other than red, green, blue and white. Also, the arrangement order of the subpixels P1, P2, P3 and P4 may be changed in various ways.

Meanwhile, in some embodiments, light emission areas EA1, EA2, EA3 and EA4 respectively provided in a plurality of subpixels P1, P2, P3 and P4 may include light emission areas divided into a plurality of areas. In detail, the first light emission area EA1 provided in the first subpixel P1 may include two divided areas, that is, a first divided light emission area EA11 and a second divided light emission area EA12. The second light emission area EA2 provided in the second subpixel P2 may include two divided areas, that is, a first divided light emission area EA21 and a second divided light emission area EA22. The third light emission area EA3 provided in the third subpixel P3 may include two divided areas, that is, a first divided light emission area EA31 and a second divided light emission area EA32. The fourth light emission area EA4 provided in the fourth subpixel P4 may include two divided areas, that is, a first divided light emission area EA41 and a second divided light emission area EA42. In some embodiments, the divided light emission areas are spaced apart from each other. For instance, the first divided light emission area EA11 and the second divided light emission area EA12 of the first subpixel P1 are divided and spaced apart from each other.

Hereinafter, for convenience of description, the description will be given based on that a first subpixel P1 is a white subpixel emitting white light, a second subpixel P2 is a green subpixel emitting green light, a third subpixel P3 is a blue subpixel emitting blue light, and a fourth subpixel P4 is a red subpixel emitting red light.

The second subpixel P2 and the fourth subpixel P4 may be provided to overlap at least a part of the first signal line SL1, and may alternately be disposed along the first signal line SL1.

The first subpixel P1 and the third subpixel P3 may be provided to overlap at least a part of the second signal line SL2, and may alternately be disposed along the second signal line SL2.

As shown in FIG. 3, the second subpixel P2 and the fourth subpixel P4 may be provided in the area where the first signal line SL1 and the second signal line SL2 cross each other, but are not limited thereto.

In another embodiment, the first subpixel P1 and the third subpixel P3 may be disposed in the area where the first signal line SL1 and the second signal line SL2 cross each other. In this case, the second subpixel P2 and the fourth subpixel P4 may be spaced apart from each other with the first subpixel P1 and the third subpixel P3, which are interposed therebetween, in the area where the first signal line SL1 and the second signal line SL2 cross each other.

Each of the first subpixel P1, the second subpixel P2, the third subpixel P3 and the fourth subpixel P4 may include a circuit element including a capacitor, a thin film transistor, and the like, and a light emitting element. The thin film transistor may include a switching transistor, a sensing transistor, and a driving transistor TR.

The switching transistor is switched in accordance with scan signals supplied to the scan lines to supply data voltages supplied from the data lines to the driving transistor TR.

The sensing transistor serves to sense a threshold voltage deviation of the driving transistor TR, which causes deterioration of picture quality.

The driving transistor is switched in accordance with a data voltage supplied from a switching thin film transistor to generate a data current from a power source supplied from the pixel power line, thereby serving to supply the generated data current to an anode electrode of a subpixel. The driving transistor includes an active layer ACT, a gate electrode GE, a source electrode SE, and a drain electrode DE.

The capacitor Cst serves to maintain the data voltage supplied to the driving transistor TR for one frame. The capacitor Cst may include two capacitor electrodes, but is not limited thereto. In one embodiment, the capacitor Cst may include three capacitor electrodes.

In detail, the active layer ACT may be provided over the first substrate 111. The active layer ACT may be formed of a silicon based semiconductor material or an oxide based semiconductor material.

A light-shielding layer LS may be provided between the active layer ACT and the first substrate 111. The light-shielding layer LS may serve as a light shielding layer for shielding external light entering the active layer ACT. The light-shielding layer LS may be made of a conductive material. For example, the light-shielding layer LS may be formed of a single layer or a multi-layer made of any one of Mo, Al, Cr, Au, Ti, Ni, Nd and Cu, or their alloy. In this case, a buffer film BF may be provided between the light-shielding layer LS and the active layer ACT.

A gate insulating layer GI may be provided over the active layer ACT. The gate insulating layer GI may be formed of an inorganic film, for example, a silicon oxide film (SiOx), a silicon nitride film (SiNx) or a multi-layered film of SiOx and SiNx.

The gate electrode GE may be provided over the gate insulating layer GI. The gate electrode GE may be formed of a single layer or a multi-layer made of any one of Mo, Al, Cr, Au, Ti, Ni, Nd and Cu, or their alloy.

An inter-layer dielectric layer ILD may be provided over the gate electrode GE. The inter-layer dielectric layer ILD may be made of an inorganic film, for example, a silicon oxide film (SiOx), a silicon nitride film (SiNx) or a multi-layered film of SiOx and SiNx.

The source electrode SE and the drain electrode DE may be provided over the inter-layer dielectric layer ILD. The source electrode SE and the drain electrode DE may be connected to the active layer ACT through a contact hole passing through the gate insulating layer GI and the inter-layer dielectric layer ILD.

The source electrode SE and the drain electrode DE may be made of a single layer or a multi-layer of any one of Mo, Al, Cr, Au, Ti, Ni, Nd and Cu, or their alloy.

A passivation layer PAS for protecting the driving transistor TR may be provided over the source electrode SE and the drain electrode DE. A planarization layer PLN for planarizing a step difference caused by the driving transistor TR may be provided over the passivation layer PAS. The planarization layer PLN may be formed of an organic film such as acryl resin, epoxy resin, phenolic resin, polyamide resin, and polyimide resin.

Light emitting diodes, which are comprised of the anode electrode 120, an organic light emitting layer 130, and a cathode electrode 140, and a bank 125 are provided over the planarization layer PLN.

An anode electrode 120 may be provided over a planarization layer PLN and connected with the driving transistor TR. The anode electrode 120 may be provided for each of the subpixels P1, P2, P3 and P4. One anode electrode 120 may be provided in the first subpixel P1, another anode electrode 120 may be provided in the second subpixel P2, the other anode electrode 120 may be provide in the third subpixel P3, and the other anode electrode 120 may be provided in the fourth subpixel P4. The anode electrode 120 is not provided in the transmissive area TA.

The anode electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO, MoTi alloy and a deposited structure (ITO/MoTi alloy/ITO) of MoTi alloy and ITO. The Ag alloy may be an alloy of silver (Ag), palladium (Pb), and Copper (Cu). The MoTi alloy may be an alloy of molybdenum (Mo) and titanium (Ti).

The anode electrode 120 included in each of the plurality of subpixels P1, P2, P3 and P4 may include a plurality of anode electrodes. For example, the anode electrode 120 included in each of the plurality of subpixels P1, P2, P3 and P4 may include a first anode electrode 121 and a second anode electrode 122.

The first anode electrode 121 may be disposed in first divided light emission areas EA11, EA21, EA31 and EA41, and the second anode electrode 122 may be disposed in second divided light emission areas EA12, EA22, EA32 and EA42. The first anode electrode 121 and the second anode electrode 122 may be disposed to be spaced apart from each other on the same layer.

The transparent display panel 110 according to one embodiment of the present disclosure may further include an anode connection electrode ACE for connecting the first anode electrode 121 with the second anode electrode 122. As shown in FIG. 4, the anode connection electrode ACE may include a first anode connection portion ACE1, a second anode connection portion ACE2, a third anode connection portion ACE3, and a fourth anode connection portion ACE4. In some embodiments, the first anode connection portion ACE1, the second anode connection portion ACE2, the third anode connection portion ACE3, and the fourth anode connection portion ACE4 at least partially overlaps the transmissive area TA (for instance, overlaps with the first transmissive area TA1 in FIG. 4).

The first anode connection portion ACE1 may be extended from the first anode electrode 121 toward the transmissive area TA as much as a selected length or predetermined length. The second anode connection portion ACE2 may be extended from the second anode electrode 122 toward the transmissive area TA as much as a selected length or predetermined length.

The third anode connection portion ACE3 may connect one end of the first anode connection portion ACE1 with one end of the second anode connection portion ACE2. Therefore, the first anode electrode 121 may electrically be connected with the second anode electrode 122 through the first connection electrode ACE.

The fourth anode connection portion ACE4 may be extended from the third anode connection portion ACE3 and disposed to overlap at least a part of the repair line RL. The fourth anode connection portion ACE4 may be connected to the repair line RL, or may electrically be disconnected from the repair line RL with at least one insulating layer interposed therebetween.

In detail, the fourth anode connection portion ACE4 of some subpixels P1, P2, P3 and P4 may be connected to the repair line RL through a first repair contact portion RCNT1. The fourth anode connection portion ACE4 of the other subpixels P1, P2, P3 and P4 may be electrically connected from the repair line RL with at least one insulating layer, for example, a planarization layer PLN and a passivation layer PAS, which are interposed therebetween. When a defective subpixel occurs, the fourth anode connection portion ACE4 and the repair line RL (in this case, RL1 in FIG. 4), which are electrically disconnected from each other, may be electrically connected with each other by a repair process. The repair line RL and the repair process will be described later.

The first anode connection portion ACE1, the second anode connection portion ACE2, the third anode connection portion ACE3, and the fourth anode connection portion ACE4 may integrally be formed on the same layer as the first anode electrode 121 and the second anode electrode 122. The area in which the first anode connection portion ACE1, the second anode connection portion ACE2, the third anode connection portion ACE3, and the fourth anode connection portion ACE4 are formed may be the non-transmissive areas NTA, but is not limited thereto. In another embodiment, the first anode connection portion ACE1, the second anode connection portion ACE2, the third anode connection portion ACE3, and the fourth anode connection portion ACE4 may be made of a transparent conductive material. In this case, the area in which the first anode connection portion ACE1, the second anode connection portion ACE2, the third anode connection portion ACE3, and the fourth anode connection portion ACE4 are formed may be the transmissive area TA.

The anode electrode 120 may be electrically connected with the driving transistor TR through the anode connection electrode ACE and a transistor connection electrode TCE.

The transistor connection electrode TCE may be disposed between the first anode connection portion ACE1 and the second anode connection portion ACE2. The transistor connection electrode TCE may be extended from a source electrode SE or a drain electrode DE of the driving transistor TR toward the transmissive area TA as much as a selected length or predetermined length. At least a portion of the transistor connection electrode TCE may be overlapped with the third anode connection portion ACE3 and may electrically be connected with the third anode connection portion ACE3 through a first contact hole CH1 in an area overlapped with the third anode connection portion ACE3.

The area in which the transistor connection electrode TCE is formed may be the non-transmissive area NTA, but is not limited thereto. The transmissive area TA may be provided between the transistor connection electrode TCE and the first anode connection portion ACE1 and between the transistor connection electrode TCE and the second anode connection portion ACE2. In another embodiment, the transistor connection electrode TCE may be made of a transparent conductive material. In this case, the area in which the transistor connection electrode TCE is formed may be the transmissive area TA. In the transparent display panel 110 according to one embodiment of the present disclosure, particles may enter any one of the first anode electrode 121 and the second anode electrode 122 during any process including the manufacturing process, whereby a dark spot may occur. In this case, the transparent display panel 110 according to one embodiment of the present disclosure may be repaired by cutting at least one of the first anode connection portion ACE1 or the second anode connection portion ACE2 of the anode connection electrode ACE.

For example, in the transparent display panel 110 according to one embodiment of the present disclosure, when a short occurs between the first anode electrode 121 and the cathode electrode 140 due to particles in the area in which the first anode electrode 121 is provided, the first anode connection portion ACE1 may be repaired by cutting along a first cutting line C1.

For another example, in the transparent display panel 110 according to one embodiment of the present disclosure, when a short occurs between the second anode electrode 122 and the cathode electrode 140 due to particles in the area in which the second anode electrode 122 is provided, the second anode connection portion ACE2 may be repaired by cutting along a third cutting line C3.

In the transparent display panel 110 according to one embodiment of the present disclosure, even though a dark spot occurs due to foreign, external particles in the display panel, one of the anode electrode of the plurality of anode electrodes 121 and 122 may be open-circuited through cutting (e.g., laser cutting or any other suitable cutting method). That is, by short-circuiting any one of the anode electrode associated with the dark spot issue among the plurality of anode electrodes 121 and 122, the occurrence of the dark spot may be reduced and a light loss rate caused by the dark spots may be reduced.

Meanwhile, in the transparent display panel 110 according to one embodiment of the present disclosure, a defect may occur in the driving transistor TR. When the transparent display panel 110 according to one embodiment of the present disclosure operates in error due to the driving transistor TR, the transistor connection electrode TCE may be cut along a second cutting line C2 in order to electrically disconnect the driving transistor TR of the corresponding subpixel from the anode electrode 120. Therefore, a signal applied from the driving transistor TR is blocked from being applied to the subpixel in which a defect occurs in the driving transistor TR, whereby the subpixel may not emit light.

The transparent display panel 110 according to one embodiment of the present disclosure may apply a signal of another adjacent subpixel to the subpixel having a defect through the repair line RL.

In detail, the transparent display panel 110 according to one embodiment of the present disclosure may include the repair line RL on at least one side of the transmissive area TA. The repair line RL may include at least two of a first repair line RL1 provided between two first subpixels P1 disposed to be adjacent to each other, a second repair line RL2 provided between two second subpixels P2 disposed to be adjacent to each other, a third repair line RL3 provided between two third subpixels P3 disposed to be adjacent to each other, and a fourth repair line RL4 provided between two fourth subpixels P4 disposed to be adjacent to each other.

The transmissive area TA may be categorized into a first transmissive area TA1 and a second transmissive area TA2 in accordance with a position where the repair line RL is disposed. In the transmissive area TA1, the repair line RL may be disposed on a side parallel with the first direction, and may be extended in the first direction.

For example, as shown in FIG. 3, the first transmissive area TA1 may be provided with a first repair line RL1 at a first side S1 parallel with the first direction. The first repair line RL1 may be extended in the first direction along the first side S1 of the first transmissive area TA1. At this time, the first repair line RL1 may be disposed between two first subpixels P1 disposed to be adjacent to each other in the first direction.

In addition, the first transmissive area TA1 may include one first repair line RL1, but is not limited thereto. The first transmissive area TA1 may further include a third repair line RL3 that faces the first repair line RL1.

For example, as shown in FIG. 3, the first transmissive area TA1 may be provided with a third repair line RL3 at a third side S3 parallel with the first direction, facing the first side S1. The third repair line RL3 may be extended in the first direction along the third side S3 of the first transmissive area TA1. At this time, the third repair line RL3 may face the first repair line RL1, and may be disposed between two third subpixels P3 disposed to be adjacent to each other in the first direction.

The second transmissive area TA2 may be disposed on an opposite side of the first transmissive area TA1 with the non-transmissive area NTA interposed therebetween. Unlike the first transmissive area TA1, in the second transmissive area TA2, the repair line RL may be disposed to be parallel with the second direction, and may be extended in the second direction.

For example, as shown in FIG. 3, the second transmissive area TA2 may be provided with a second repair line RL2 at a second side S2 that is parallel with the second direction. The second repair line RL2 may be extended in the second direction along the second side S2 of the second transmissive area TA2. At this time, the second repair line RL2 may be disposed between two second subpixels P2 disposed to be adjacent to each other in the second direction.

The second transmissive area TA2 may include one second repair line RL2, but is not limited thereto. The second transmissive area TA2 may further include a fourth repair line RL4 facing the second repair line RL2.

For example, as shown in FIG. 3, the second transmissive area TA2 may be provided with a fourth repair line RL4 at a fourth side S4 parallel with the second direction, facing the second side S2. The fourth repair line RL4 may be extended in the second direction along the fourth side S4 of the second transmissive area TA2. At this time, the fourth repair line RL4 faces the second repair line RL2 and may be disposed between two fourth subpixels P4 disposed to be adjacent to each other in the second direction.

Each of the first, second, third and fourth repair lines RL1, RL2, RL3 and RL4 disposed as described above may be electrically connected to one anode connection electrode ACE of two subpixels disposed to be adjacent to each other at one end through the first repair contact portion RCNT1. Each of the first, second, third and fourth repair lines RL1, RL2, RL3 and RL4 may be electrically disconnected from the other anode connection electrode ACE of two subpixels disposed to be adjacent to each other at the other end, with at least one insulating layer, for example, a planarization layer PLN and a passivation layer PAS, which are interposed therebetween.

In detail, the first subpixels P1 may be disposed to be adjacent to each other in the first direction with the first transmissive area TA1 interposed therebetween. The anode connection electrode ACE extended from the anode electrode 120 of the first subpixel P1 may be disposed at the second side S2 or the fourth side S4 provided between the first side S1 and the third side S3 of the first transmissive area TA1. The anode connection electrode ACE extended from the anode electrode 120 of one first subpixel P1 may be disposed at the second side S2 of the first transmissive area TA1, and the anode connection electrode ACE extended from the anode electrode 120 of the other first subpixel P1 may be disposed at the fourth side S4 of the first transmissive area TA1. As a result, the anode connection electrode ACE of one first subpixel P1 and the anode connection electrode ACE of the other first subpixel P1 adjacent to one subpixel P1 may be disposed to face each other with the first transmissive area TA1 interposed therebetween.

The first repair line RL1 may be electrically connected with the fourth anode connection portion ACE4 of the anode connection electrode ACE of one first subpixel P1 through the first repair contact portion RCNT1 passing through the planarization layer PLN and the passivation layer PAS at one end.

At least a portion of the first repair line RL1 may overlap the fourth anode connection portion ACE4 of the anode connection electrode ACE of the other first subpixel P1 at the other end to form a welding point WP. At this time, the first repair line RL1 may be electrically disconnected from the fourth anode connection portion ACE4 with the planarization layer PLN and the passivation layer PAS interposed therebetween. The fourth anode connection portion ACE4 may be formed to be flat on the planarization layer PLN, but as shown in FIG. 5, may have a step difference at the welding point WP along a hole provided in the planarization layer PLN. In detail, since the planarization layer PLN is relatively thick, the planarization layer PLN may partially be removed from a position corresponding to the welding point WP to form a hole. Therefore, the fourth anode connection portion ACE4 may be spaced apart from the first repair line RL1 in the welding point WP with only the passivation layer PAS interposed therebetween.

Therefore, before the repair process is performed, the signal applied to one first subpixel P1 may not be applied to the other first subpixel P1 adjacent to one first subpixel P1.

However, when a defect occurs in the driving transistor TR of any one of one first subpixel P1 and the other first subpixels P1, a repair process for connecting the first subpixel P1 having a defect with the first subpixel P1 of a normal state may be performed.

The repair process may include a test process, a cutting process, and a welding process. The test process may detect whether the plurality of subpixels P1, P2, P3 and P4 are defective. The cutting process may cut the transistor connection electrode TCE to block a signal applied from the driving transistor TR from being applied to the first subpixel P1 that is determined to be defective. That is, the cutting process included in the repair process involves electrically disconnecting a component from another component. On the other hand, the welding process included in the repair process involves electrically connecting a component from another component. The detail of the welding process will be explained in detail below in connection with the relevant figures.

The welding process may electrically connect the first subpixel P1 of the normal state with the first subpixel P1 having a defect to apply a signal of the first subpixel P1 of the normal state, which is adjacent to the first subpixel P1 having a defect, to the first subpixel P1 having a defect. In detail, the welding process may electrically connect the other end of the first repair line RL1 and the fourth another connection portion ACE4 of the anode connection electrode ACE, which are electrically disconnected from each other, with each other as shown in FIG. 6 by irradiating laser to the welding point WP in which the first repair line RL1 and the fourth anode connection portion ACE4 of the anode connection electrode ACE overlap each other. At this time, the welding process may irradiate laser to a lower portion of the first repair line RL1 or an upper portion of the fourth anode connection portion ACE4. The welding process may be performed before the light emitting layer 130 or the cathode electrode 140 is deposited, and in this case, the other end of the first repair line RL1 and the fourth anode connection portion ACE4 of the anode connection electrode ACE, which are electrically disconnected from each other, may electrically be connected with each other by irradiating laser to the upper portion of the fourth anode connection portion ACE4. Alternatively, the welding process may be performed after the light-emitting layer 130 or the cathode electrode 140 is deposited, and in this case, the other end of the first repair line RL1 and the fourth anode connection portion ACE4 of the anode connection electrode ACE, which are electrically disconnected from each other, may electrically be connected with each other by irradiating laser to the lower portion of the first repair line RL1.

In the transparent display panel 110 according to one embodiment of the present disclosure, the other end of the first repair line RL1 and the fourth anode connection portion ACE4 of the anode connection electrode ACE may be connected with each other through a repair process, whereby a signal of the first subpixel P1 of the normal state may be applied to the first subpixel P1 having a defect.

Meanwhile, the second subpixels P2 may be disposed to be adjacent to each other in the second direction with the second transmissive area TA2 interposed therebetween. The anode connection electrode ACE extended from the anode electrode 120 of the second subpixel P2 may be disposed at the first side S1 or the third side S3 provided between the second side S2 and the fourth side S4 of the second transmissive area TA2. The anode connection electrode ACE extended from the anode electrode 120 of one second subpixel P2 may be disposed at the first side S1 of the second transmissive area TA2, and the anode connection electrode ACE extended from the anode electrode 120 of the other second subpixel P2 adjacent to one second subpixel P2 may be disposed at the third side S3 of the second transmissive area TA2. As a result, the anode connection electrode ACE of one second subpixel P2 and the anode connection electrode ACE of the other second subpixel P2 adjacent to one second subpixel P2 may be disposed to face each other with the second transmissive area TA2 interposed therebetween.

The second repair line RL2 may be electrically connected with the fourth anode connection portion ACE4 of the anode connection electrode ACE of one second subpixel P2 through the first repair contact portion RCNT1 passing through the planarization layer PLN and the passivation layer PAS at one end.

At least a portion of the second repair line RL2 may overlap the fourth anode connection portion ACE4 of the anode connection electrode ACE of the other second subpixel P2 at the other end to form the welding point WP. At this time, the second repair line RL2 may electrically be disconnected from the fourth anode connection portion ACE4 at the welding point WP with the planarization layer PLN and the passivation layer PAS interposed therebetween.

Therefore, the signal applied to one second subpixel P2 may not be applied to the other second subpixel P2 adjacent to one second subpixel P2 until the repair process is performed.

However, when a defect occurs in the driving transistor TR of any one of one second subpixel P2 and the other second subpixel P2, the repair process of connecting the second subpixel P2 in which a defect occurs with the second subpixel P2 of the normal state may be performed.

The repair process may cut the transistor connection electrode TCE through the cutting process to block a signal applied from the driving transistor TR from being applied to the second subpixel P2 that is determined to be defective.

The repair process may electrically connect the second subpixel P2 of the normal state with the second subpixel P2 having a defect, to apply the signal of the second subpixel P2 of the normal state to the second subpixel P2 having a defect. In detail, the welding process may electrically connect the other end of the second repair line RL2 and the fourth anode connection portion ACE4 of the anode connection electrode ACE, which are electrically disconnected from each other, with each other by irradiating laser to the welding point WP where the second repair line RL2 and the fourth anode connection portion ACE4 of the anode connection electrode ACE overlap each other.

In the transparent display panel 110 according to one embodiment of the present disclosure, the other end of the second repair line RL2 and the fourth anode connection portion ACE4 of the anode connection electrode ACE of the second subpixel P2 may be connected with each other through the repair process, whereby the signal of the second subpixel P2 of the normal state may be applied to the second subpixel P2 having a defect.

Meanwhile, as the third repair line RL3 is disposed in parallel with the first repair line RL1 with the first transmissive area TA1 interposed therebetween, the subpixel connected to the third repair line RL3 is different from that connected to the first repair line RL1 but the substantially same connection structure or repair process is applied to these repair lines. Therefore, a detailed description of the connection structure and repair process of the third repair line RL3 will be omitted.

In addition, as the fourth repair line RL4 is disposed in parallel with the second repair line RL2 with the second transmissive area TA2 interposed therebetween, the subpixel connected to the fourth repair line RL4 is different from that connected to the second repair line RL2 but the substantially same connection structure or repair process is applied to these repair lines. Therefore, a detailed description of the connection structure and repair process of the fourth repair line RL4 will be omitted.

The repair lines RL1, RL2, RL3 and RL4 may be disposed over one of the layers except for the layer over which the anode electrode 120 is disposed. The repair lines RL1, RL2, RL3 and RL4 may be provided on the same layer as any one of the light-shielding layer LS, the active layer ACT, the gate electrode GE, the source electrode SE, and the drain electrode DE.

For example, when the light-shielding layer LS is formed of a conductive material, the repair lines RL1, RL2, RL3 and RL4 may be formed on the same layer as the light-shielding layer LS.

For another example, the repair lines RL1, RL2, RL3 and RL4 may be provided on the same layer as the source electrode SE or the drain electrode DE. When the repair lines RL1, RL2, RL3 and RL4 are provided on the same layer as the source electrode SE or the drain electrode DE, the number of contact portions may be reduced and a size of the contact portion may be reduced as compared with the case that the repair lines RL1, RL2, RL3 and RL4 are provided on the same layer as the light-shielding layer LS.

When the repair lines RL1, RL2, RL3 and RL4 are provided on the same layer as the light-shielding layer LS, a second repair contact portion RCNT2, which passes through the buffer layer BF, the gate insulating layer GI, the interlayer dielectric layer ILD, the passivation layer PAS and the planarization layer PLN, may be beneficial to be connected with the fourth anode connection portion ACE4 of the anode connection electrode ACE. At this time, the second repair contact portion RCNT2 may be difficult to pass through the buffer layer BF, the gate insulating layer GI, the interlayer dielectric layer ILD, the passivation layer PAS and the planarization layer PLN at once, and may be formed in a plural number. For example, the second repair contact portion RCNT2 may include a first contact portion passing through the buffer layer BF, the gate insulating layer GI and the interlayer dielectric layer ILD, and a second contact portion passing through the passivation layer PAS and the planarization layer PLN.

In this way, when the repair lines RL1, RL2, RL3 and RL4 are provided on the same layer as the light-shielding layer LS, since a plurality of contact portions should be formed, a size of the contact portion should be increased to form the plurality of contact portions to be overlapped.

On the other hand, when the repair lines RL1, RL2, RL3 and RL4 are provided on the same layer as the source electrode SE or the drain electrode DE, the second repair contact portion RCNT2 passing through the passivation layer PAS and the planarization layer PLN may be beneficial. At this time, since the second repair contact portion RCNT2 has only to pass through the passivation layer PAS and the planarization layer PLN, only one contact portion is formed. Therefore, when the repair lines RL1, RL2, RL3 and RL4 are provided on the same layer as the source electrode SE or the drain electrode DE, the size of the contact portion provided in the transmissive area TA may be reduced or minimized, and the light loss rate due to the application of the repair structure may be reduced or minimized.

The bank 125 may be provided over the planarization layer PLN. In addition, the bank 125 may be provided between the anode electrodes 120. The bank 125 may be formed to cover or at least partially cover edges of each of the anode electrodes 120 and expose a portion of each of the anode electrodes 120. Therefore, the bank 125 may prevent light emission efficiency from being deteriorated by a current concentrated on each end of the anode electrodes 120.

The bank 125 may define the light emission areas EA11, EA12, EA21, EA22, EA31, EA32, EA41 and EA42 of each of the subpixels P1, P2, P3 and P4. The light emission areas EA11, EA12, EA21, EA22, EA31, EA32, EA41 and EA42 of each of the subpixels P1, P2, P3 and P4 refer to areas in which the anode electrode 120, the organic light emitting layer 130, and the cathode electrode 140 are sequentially deposited so that holes from the anode electrode 120 and electrons from the cathode electrode 140 are combined with each other in the organic light emitting layer 130 to emit light. In this case, since the area in which the bank 125 is formed does not emit light, the area may be a non-light emission area, and the area in which the bank 125 is not formed and the anode electrode 120 is exposed may be the light emission areas EA11, EA12, EA21, EA22, EA31, EA32, EA41 and EA42.

In addition, the bank 125 may also be provided over the repair lines RL1, RL2, RL3 and RL4 formed on at least one side of the transmissive area TA and the anode connection electrode ACE formed to be protruded from the light emission area to the transmissive area TA.

The bank 125 may be formed of an organic layer, for example, acryl resin, epoxy resin, phenolic resin, polyamide resin, polyimide resin, etc.

The organic light emitting layer 130 may be provided over the anode electrode 120. The organic light emitting layer 130 may include a hole transporting layer, a light emitting layer, and an electron transporting layer. In this case, if a voltage is applied to the first anode electrode 120 and the cathode electrode 140, holes and electrons move to the light emitting layer through the hole transporting layer and the electron transporting layer, respectively, and are combined with each other in the light emitting layer to emit light.

In one embodiment, the organic light emitting layer 130 may be a common layer commonly provided for the subpixels P1, P2, P3 and P4. For example, the organic light emitting layer 130 may be a white light emitting layer emitting white light.

In another embodiment, the organic light emitting layer 130 may include light emitting layers provided per subpixels P1, P2, P3 and P4. For example, a white light emitting layer emitting white light may be provided in the first subpixel P1, a green light emitting layer emitting green light may be provided in the second subpixel P2, a blue light emitting layer emitting blue light may be provided in the third subpixel P3, and a red light emitting layer emitting red light may be provided in the fourth subpixel P4. In this case, the light emitting layers of the organic light emitting layer 130 are not provided in the transmissive area TA.

The cathode electrode 140 may be provided over the organic light emitting layer 130 and the bank 125. The cathode electrode 140 may be provided in the transmissive area TA as well as the non-transmissive area NTA that includes the emission area EA, but is not limited thereto. The cathode electrode 140 may be provided only in the non-transmissive area NTA that includes the emission area EA, but may not be provided in the transmissive area TA to improve transmittance.

The cathode electrode 140 may be a common layer commonly provided in the subpixels P1, P2, P3 and P4 to apply the same voltage. The cathode electrode 140 may be formed of a conductive material that may transmit light. For example, the cathode electrode 140 may be formed of a low resistance metal material, for example, Ag, or alloy of Mg and Ag.

An encapsulation layer 150 may be provided over the light emitting diodes. The encapsulation layer 150 may be provided over the cathode electrode 140 to overlay the cathode electrode 140. The encapsulation layer 150 serves to prevent oxygen or water from being permeated into the organic light emitting layer 130 and the cathode electrode 140. Accordingly, in some embodiments, the encapsulation layer 150 may include at least one inorganic layer and at least one organic layer.

Meanwhile, although not shown in FIG. 5 and FIG. 6, a capping layer may additionally be provided between the cathode electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels P1, P2, P3 and P4. In detail, the color filter CF may include a first color filter CF1, a second color filter CF2, and a third color filter CF3. A transparent color filter made of a transparent organic material may be provided in the first sub-pixel P1 or a separate color filter may not be provided. The first color filter CF1 may be disposed to correspond to the emission area EA2 of the second subpixel P2, and may be a green color filter that transmits green light. The second color filter CF2 may be disposed to correspond to the emission area EA3 of the third subpixel P3, and may be a blue color filter that transmits blue light. The third color filter CF3 may be disposed to correspond to the emission area EA4 of the fourth subpixel P4, and may be a red color filter that transmits red light.

In the transparent display panel 110 according to one embodiment of the present disclosure, a polarizer is not used, and the color filter CF is formed in the second substrate 112. When the polarizer is attached to the transparent display panel 110, transmittance of the transparent display panel 110 is reduced by the polarizer. When the polarizer is not attached to the transparent display panel 110, a problem occurs in that externally incident light is reflected in the electrodes.

The transparent display panel 110 according to one embodiment of the present disclosure may prevent transmittance from being reduced as a polarizer is not attached thereto. Also, in the transparent display panel 110 according to one embodiment of the present disclosure, the color filter CF may be formed in the second substrate 112 to partially absorb externally incident light, thereby preventing the incident light from being reflected in the electrodes. That is, the transparent display panel 110 according to one embodiment of the present disclosure may reduce external light reflectance without reducing transmittance.

Meanwhile, a black matrix BM may be provided between color filters CF and between the color filter CF and the transmissive area TA. The black matrix BM may be provided among the subpixels P1, P2 and P3 to prevent color mixture from occurring among the subpixels P1, P2 and P3 adjacent to one another. The black matrix BM may be provided between the subpixels P1, P2, P3 and P4 and the transmissive area TA so that light emitted from the subpixels P1, P2, P3 and P4 may not move to a side, for example, the transmissive area TA.

The black matrix BM may include a material that absorbs light, for example, a black dye that fully absorbs light of a visible light wavelength range.

The transparent display panel 110 according to one embodiment of the present disclosure is characterized in that a position and an extension direction in which the repair line RL is disposed are different between the first transmissive area TA1 and the second transmissive area TA2.

In detail, in the transparent display panel 110 according to one embodiment of the present disclosure, the repair line RL may be extended from the first transmissive area TA1 along the first side S1 or the third side S3 of the first transmissive area TA1 in the first direction. In addition, in the transparent display panel 110 according to one embodiment of the present disclosure, the repair line RL may be extended from the second transmissive area TA2 along the second side S2 or the fourth side S4 of the second transmissive area TA2 in the second direction.

In the transparent display panel 110 according to one embodiment of the present disclosure, the repair lines RL may be spaced apart from each other without overlapped with each other. In this case, the repair lines RL may have a spaced distance greater than a width of the non-transmissive area NTA.

When the repair line RL is disposed to partially overlap or adjoin another repair line RL, since the repair line RL is extended by bypassing the repair contact portion of another repair line RL, its length is increased. In the transparent display panel 110, the repair line RL may be disposed in the transmissive area TA. In this case, when an area of the repair line RL is increased, a size of the transmissive area TA is reduced, whereby light transmittance may be deteriorated.

On the other hand, in the transparent display panel 110 according to one embodiment of the present disclosure, since each of the repair lines RL is not disposed to overlap or adjoin another repair line RL, the repair line may not bypass the repair contact portion. In the transparent display panel 110 according to one embodiment of the present disclosure, since the repair line RL may be formed in a straight line, its length may be reduced. Therefore, the transparent display panel 110 according to one embodiment of the present disclosure may prevent the size of the transmissive area TA from being reduced by the repair line RL. That is, in the transparent display panel 110 according to one embodiment of the present disclosure, deterioration of light transmittance, which is caused by the repair line RL, may be reduced.

Meanwhile, in the transparent display panel 110 according to one embodiment of the present disclosure, the repair line RL may not overlap the first signal line SL1 and the second signal line SL2 in accordance with the above-described feature.

The repair line RL may partially overlap the first signal line SL1 or the second signal line SL2 to connect subpixels of the same color with each other when a subpixels of a different color is disposed between the subpixels of the same color. In this case, parasitic capacitance may be increased between the repair line RL and the plurality of signal lines.

In the transparent display panel 110 according to one embodiment of the present disclosure, since the repair line RL connects the subpixels of the same color, which face each other with the first transmissive area TA1 or the second transmissive area TA2 interposed therebetween, with each other, the repair line RL may be spaced apart from the first signal line SL1 or the second signal line SL2 with a sufficient distance without being overlapped with the first signal line SL1 or the second signal line SL2. Therefore, the transparent display panel 110 according to one embodiment of the present disclosure may reduce or minimize parasitic capacitance between the repair line RL and the plurality of signal lines.

Although FIGS. 3 to 6 show that the repair line RL is disposed in the transmissive area TA, the repair line RL is not limited thereto.

In another embodiment, the repair line RL may be disposed in a non-transmissive area NTA. Hereinafter, an embodiment in which the repair line RL is disposed in the non-transmissive area NTA will be described in detail with reference to FIGS. 7 to 10.

Figure 7:
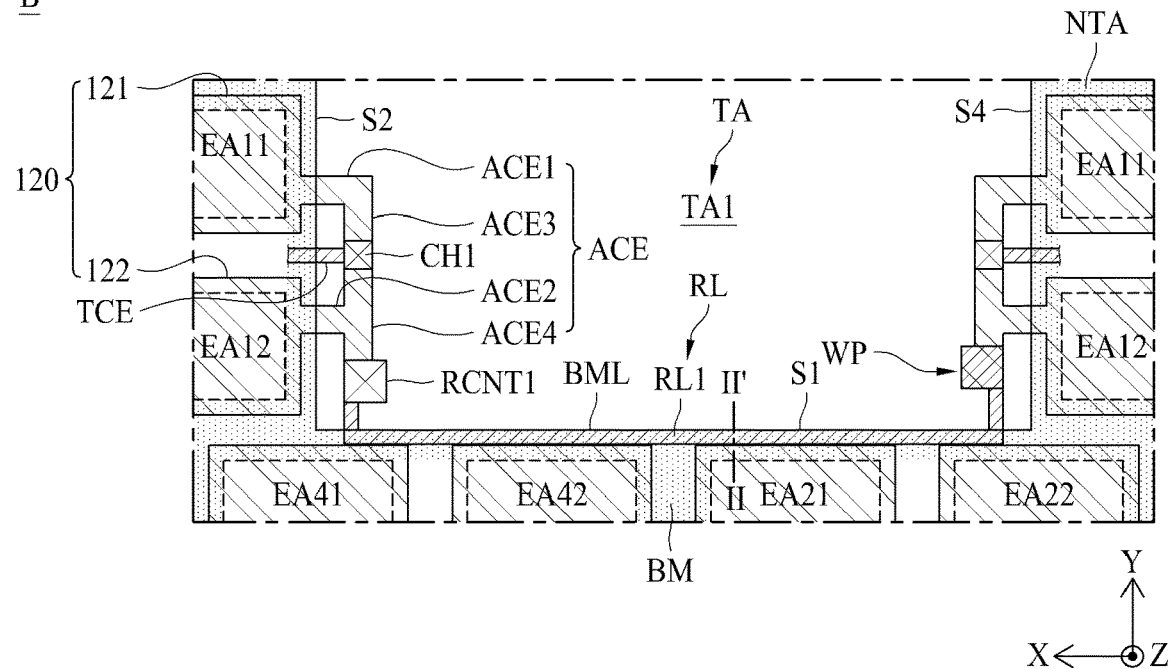
FIG. 7 is an enlarged view illustrating a modified example in the area B of FIG. 3.
Figure 8:
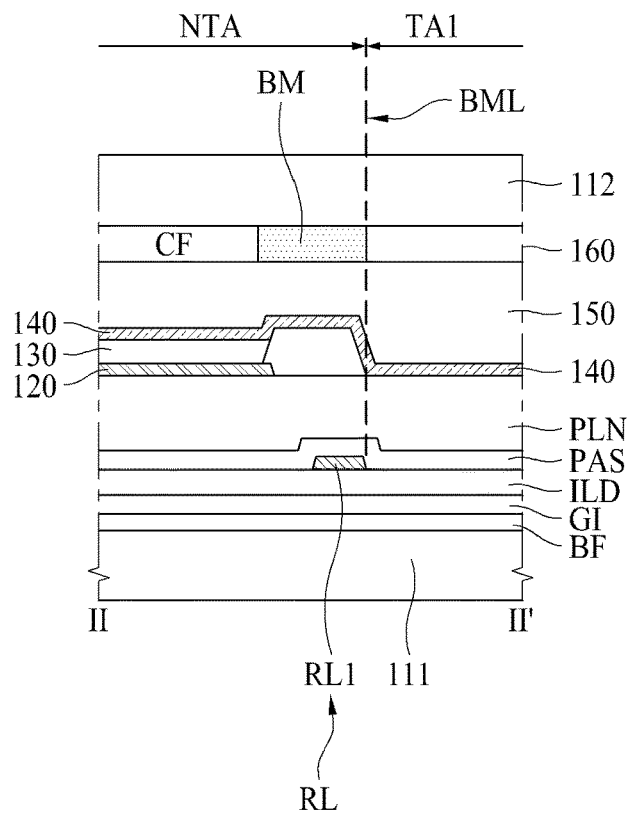
FIG. 8 is a cross-sectional view taken along line II-IP of FIG. 7.
Figure 10:
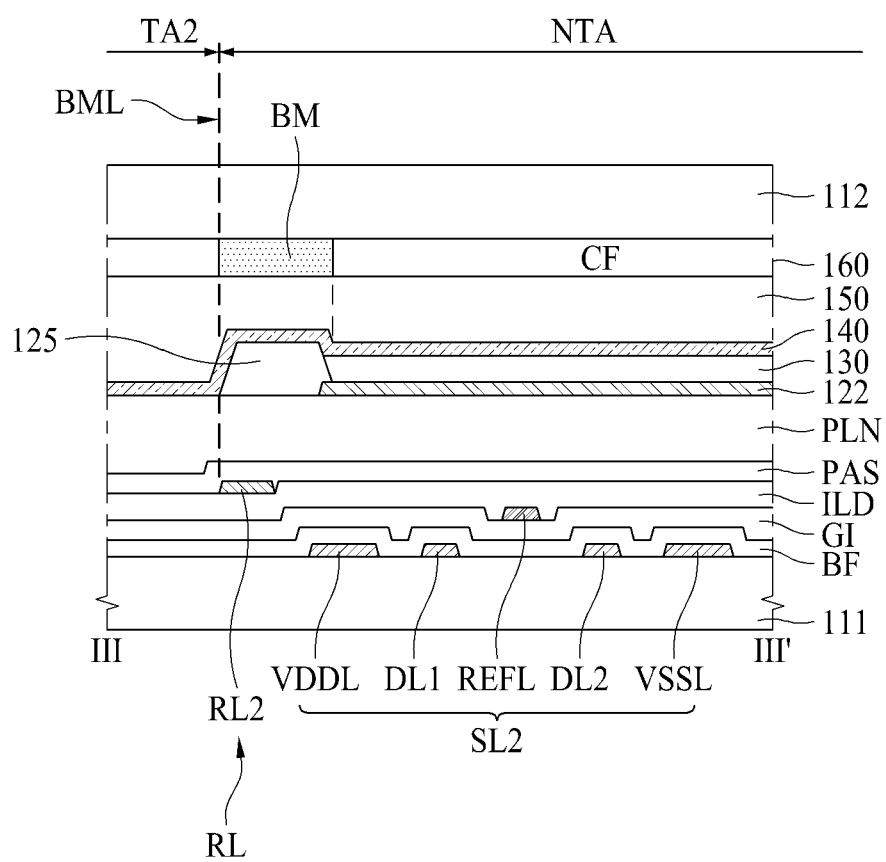
FIG. 10 is a cross-sectional view taken along line of FIG. 9.

FIG. 7 is an enlarged view illustrating a modified example in the area B of FIG. 3, FIG. 8 is a cross-sectional view taken along line II-IP of FIG. 7, FIG. 9 is an enlarged view illustrating a modified example in an area C of FIG. 3, and FIG. 10 is a cross-sectional view taken along line of FIG. 9.

The transparent display panel 110 shown in FIGS. 7 to 9 is different from the transparent display panel 110 shown in FIGS. 3 to 6 in that the repair line RL is disposed in the non-transmissive area NTA. Hereinafter, a repeated description will be omitted, and the following description will be based on the difference from FIGS. 3 to 6.

Referring to FIGS. 7 and 8, the first subpixels P1 may be disposed to be adjacent to each other in the first direction with the first transmissive area TA1 interposed therebetween. The anode connection electrode ACE extended from the anode electrode 120 of one first subpixel P1 may be disposed at the second side S2 of the first transmissive area TA1, and the anode connection electrode ACE extended from the anode electrode 120 of the other first subpixel P1 may be disposed at the fourth side S4 of the first transmissive area TA1. As a result, the anode connection electrode ACE of one first subpixel P1 and the anode connection electrode ACE of the other first subpixel P1 adjacent to one first subpixel P1 may be disposed to face each other with the first transmissive area TA1 interposed therebetween.

The first repair line RL1 may be disposed between two first subpixels P1 disposed to be adjacent to each other in the first direction, and may be extended in the first direction along the first side S1 of the first transmissive area TA1. At this time, the first repair line RL1 is not disposed in the first transmissive area TA1, and at least a portion of the first repair line RL1 may overlap the non-transmissive area NTA.

In detail, the non-transmissive area NTA may include a light emission area EA in which light emitted from each of the subpixels P1, P2, P3 and P4 is emitted to the outside. A black matrix BM may be disposed between the first transmissive area TA1 and the light emission area EA to prevent light emitted from each of the plurality of subpixels P1, P2, P3 and P4 from moving to the first transmissive area TA1.

As shown in FIGS. 7 and 8, at least a portion of the first repair line RL1 may overlap the black matrix BM. In one embodiment, a boundary of the first repair line RL1 with the first transmissive area TA1 may be aligned or matched with a boundary line BML between the black matrix BM and the first transmissive area TA1.

However, one end of the first repair line RL1 may be protruded toward the first transmissive area TA1 to reach the first repair contact portion RCNT1 in order to be electrically connected with the fourth anode connection portion ACE4 of the anode connection electrode ACE of one first subpixel P1.

In addition, the other end of the first repair line RL1 may be protruded toward the first transmissive area TA1 to reach the welding point WP in order to overlap the fourth anode connection portion ACE4 of the anode connection electrode ACE of the other first subpixel P1.

In the transparent display panel 110 according to another embodiment of the present disclosure, even though the first repair contact portion RCNT1 and the welding point WP are formed in the first transmissive area TA1, most of the first repair line RL1 may be disposed in the non-transmissive area NTA. Therefore, in the transparent display panel 110 according to another embodiment of the present disclosure, reduction in the size of the first transmissive area TA, which is caused by the first repair line RL1, may be reduced or minimized. That is, in the transparent display panel 110 according to one embodiment of the present disclosure, deterioration of light transmittance, which is caused by the first repair line RL1, may be reduced or minimized.

The third repair line RL3 is not shown in FIGS. 7 and 8 in detail. However, the third repair line RL3 is disposed in parallel with the first repair line RL1 with the first transmissive area TA1 interposed therebetween, and the subpixel connected to the third repair line RL3 is different from that connected to the first repair line RL1 but the substantially same connection structure or repair process is applied to these repair lines. Therefore, a detailed description of arrangement of the third repair line RL3 will be omitted.

Referring to FIGS. 9 and 10, the second subpixels P2 may be disposed to be adjacent to each other in the second direction with the second transmissive area TA2 interposed therebetween. The anode connection electrode ACE extended from the anode electrode 120 of one second subpixel P2 may be disposed at the first side S1 of the second transmissive area TA2, and the anode connection electrode ACE extended from the anode electrode 120 of the other second subpixel P2 may be disposed at the third side S3 of the second transmissive area TA2. As a result, the anode connection electrode ACE of one second subpixel P2 and the anode connection electrode ACE of the other second subpixel P2 adjacent to one second subpixel P2 may be disposed to face each other with the second transmissive area TA2 interposed therebetween.

The second repair line RL2 may be disposed between two second subpixels P2 disposed to be adjacent to each other in the second direction, and may be extended in the second direction along the second side S2 of the second transmissive area TA2. At this time, the second repair line RL2 may be disposed in parallel with the second signal line SL2 as shown in FIGS. 9 and 10.

The second signal line SL2 may include a pixel power line VDDL, a first data line DL1, a reference line REFL, a second data line DL2, and a common power line VSSL.

The reference line REFL may be provided in the non-transmissive area NTA and extend in the second direction (e.g., Y-axis direction). The reference line REFL may supply a reference voltage (or an initialization voltage or a sensing voltage) to the driving transistor TR of each of the subpixels P1, P2, P3 and P4.

The first data line DL1 may be provided in the non-transmissive area NTA, disposed at the first side of the reference line REFL and extended in the second direction (e.g., Y-axis direction). The first data line DL1 may supply a data voltage to at least a portion of the subpixels P1, P2, P3 and P4. The second data line DL2 may be provided in the non-transmissive area NTA, disposed at the second side of the reference line REFL and extended in the second direction (e.g., Y-axis direction). At this time, the second side of the reference line REFL may be a side facing the first side. The second data line DL2 may supply a data voltage to the other subpixels except the subpixel connected with the first data line DL1 among the subpixels P1, P2, P3 and P4.

The pixel power line VDDL may be provided in the non-transmissive area NTA and extended in the second direction (e.g., Y-axis direction). The pixel power line VDDL may supply a first power source to the anode electrode 120 of each of the subpixels P1, P2, P3 and P4.

The common power line VSSL may be provided in the non-transmissive area NTA and extended in the second direction (e.g., Y-axis direction). The common power line VSSL may supply a second power source to the cathode electrodes 140 of each of the subpixels P1, P2, P3 and P4.

The second repair line RL2 is not disposed in the second transmissive area TA2 and at least a portion thereof may overlap the non-transmissive area NTA.

In detail, the non-transmissive area NTA may include a light emission area EA through which light emitted from each of the subpixels P1, P2, P3 and P4 is emitted to the outside. A black matrix BM may be disposed between the second transmissive area TA2 and the light emission area EA to prevent light emitted from each of the plurality of subpixels P1, P2, P3 and P4 from moving to the second transmissive area TA2.

As shown in FIGS. 9 and 10, at least a portion of the second repair line RL2 may overlap the black matrix BM. In one embodiment, a boundary of the second repair line RL2 with the second transmissive area TA2 may be aligned or matched with a boundary line BML between the black matrix BM and the second transmissive area TA2.

However, one end of the second repair line RL2 may be protruded toward the second transmissive area TA2 to reach the first repair contact portion RCNT1 in order to be electrically connected with the fourth anode connection portion ACE4 of the anode connection electrode ACE of one second subpixel P2.

In addition, the other end of the second repair line RL2 may be protruded toward the second transmissive area TA2 to reach the welding point WP in order to overlap the fourth anode connection portion ACE4 of the anode connection electrode ACE of the other second subpixel P2.

In the transparent display panel 110 according to another embodiment of the present disclosure, even though the first repair contact portion RCNT1 and the welding point WP are formed in the second transmissive area TA2, most of the second repair line RL2 may be disposed in the non-transmissive area NTA. Therefore, in the transparent display panel 110 according to another embodiment of the present disclosure, reduction in the size of the second transmissive area TA2, which is caused by the second repair line RL2, may be reduced or minimized. That is, in the transparent display panel 110 according to one embodiment of the present disclosure, deterioration of light transmittance, which is caused by the second repair line RL2, may be reduced or minimized.

The fourth repair line RL4 is not shown in FIGS. 9 and 10 in detail. However, the fourth repair line RL4 is disposed in parallel with the second repair line RL2 with the second transmissive area TA2 interposed therebetween, and the subpixel connected to the fourth repair line RL4 is different from that connected to the second repair line RL2 but the substantially same connection structure or repair process is applied to these repair lines. Therefore, a detailed description of arrangement of the fourth repair line RL4 will be omitted.

FIG. 11 is a view illustrating an algorithm for a signal applied to a subpixel in which a defect occurs after a repair process.

Referring to FIGS. 3 and 11, the first repair line RL1 may be disposed between the first subpixel P1 connected to the Nth first signal line SL1 and the Mth second signal line SL2, and the first subpixel P1 connected to the Nth first signal line SL1 and the (M-1)th second signal line SL2. The first repair line RL1 may be disposed in a first side direction of the first subpixel P1 connected to the Nth first signal line SL1 and the Mth second signal line SL2, for example, in a left side direction of the first subpixel P1. On the other hand, the first repair line RL1 may be disposed in a second side direction of the first subpixel P1 connected to the Nth first signal line SL1 and the (M-1)th second signal line SL2, for example, in a right side direction of the first subpixel P1.

The N may be an even or odd number greater than zero (0). The M may be an even or odd number greater than zero (0). The first signal line SL1 may be a scan line. The second signal line SL2 may be a first data line or a second data line.

For example, the first repair line RL1 may be disposed between the first subpixel P1 connected to the second one of the first signal lines SL1 and the second one of the second signal lines SL2 and the first subpixel P1 connected to the second one of the first signal lines SL1 and the first one of the second signal lines SL2.

When a defect occurs in the driving transistor, a signal of the first subpixel P1 connected to the Nth first signal line SL1 and the (M−1)th second signal line SL2 may be applied to the first subpixel P1 connected to the Nth first signal line SL1 and the Mth second signal line SL2 through the repair process.

For example, a repair algorithm may allow a signal of Row(n) and Col(m−1) to be applied to the first subpixel P1 connected to the Nth first signal line SL1 and the Mth second signal line SL2. In this case, n may correspond to a position of a row of the corresponding subpixel, and m may correspond to a position of a column (Col) of the corresponding subpixel.

The first repair line RL1 may be disposed in the subpixel P1 connected to the Nth first signal line SL1 and the Mth second signal line SL2 in the same direction as the first subpixel P1 connected to the (N+1)th first signal line SL1 and the (M+1)th second signal line SL2. In this case, the first subpixel P1 connected to the Nth first signal line SL1 and the Mth second signal line SL2 may have the same repair algorithm as that of the first subpixel P1 connected to the (N+1)th first signal line SL1 and the (M+1)th second signal line SL2, as shown in FIG. 11.

On the other hand, the first repair line RL1 may be disposed in the subpixel P1 connected to the Nth first signal line SL1 and the Mth second signal line SL2 in a different from the first subpixel P1 connected to the Nth first signal line SL1 and the (M+1)th second signal line SL2 and the first subpixel P1 connected to the (N+1)th first signal line SL1 and the Mth second signal line SL2. In this case, the first subpixel P1 connected to the Nth first signal line SL1 and the Mth second signal line SL2 may have a repair algorithm different from those of the first subpixel P1 connected to the Nth first signal line SL1 and the (M+1)th second signal line SL2 and the first subpixel P1 connected to the (N+1)th first signal line SL1 and the Mth second signal line SL2, as shown in FIG. 11.

The second repair line RL2 may be disposed between the second subpixel P2 connected to the Nth first signal line SL1 and the Mth second signal line SL2 and the second subpixel P2 connected to the (N+1)th first signal line SL1 and the Mth second signal line SL2. The second repair line RL2 may be disposed in the second subpixel P2 connected to the Nth first signal line SL1 and the Mth second signal line SL2 in a third side direction, for example, a lower side direction. On the other hand, the second repair line RL2 may be disposed in the second subpixel P2 connected to the (N+1)th first signal line SL1 and the Mth second signal line SL2 in a fourth side direction, for example, an upper side direction.

For example, the second repair line RL2 may be disposed between the second subpixel P2 connected to the second one of the first signal lines SL1 and the second one of the second signal lines SL2 and the second subpixel P2 connected to the third one of the first signal lines SL1 and the second one of the second signal lines SL2.

When a defect occurs in the driving transistor, a signal of the second subpixel P2 connected to the (N+1)th first signal line SL1 and the Mth second signal line SL2 may be applied to the second subpixel P2 connected to the Nth first signal line SL1 and the Mth second signal line SL2 through the repair process.

For example, the repair algorithm may allow a signal of Row(n+1) and Col(m) to be applied to the second subpixel P2 connected to the Nth first signal line SL1 and the Mth second signal line SL2.

Meanwhile, when a defect occurs in the driving transistor, a signal of the second subpixel P2 connected to the Nth first signal line SL1 and the Mth second signal line SL2 may be applied to the second subpixel P2 connected to the (N+1)th first signal line SL1 and the Mth second signal line SL2 through the repair process.

For example, the repair algorithm may allow a signal of Row(n−1) and Col(m) to be applied to the second subpixel P2 connected to the (N+1)th first signal line SL1 and the Mth second signal line SL2.

Meanwhile, the second repair line RL2 may be disposed in the second subpixel P2 connected to the Nth first signal line SL1 and the Mth second signal line SL2 in the same direction as the second subpixel P2 connected to the (N+1)th first signal line SL1 and the (M+1)th second signal line SL2. In this case, the second subpixel P2 connected to the Nth first signal line SL1 and the Mth second signal line SL2 may have the same repair algorithm as that of the second subpixel P2 connected to the (N+1)th first signal line SL1 and the (M+1)th second signal line SL2, as shown in FIG. 11.

On the other hand, the second repair line RL2 may be disposed in the second subpixel P2 connected to the Nth first signal line and the Mth second signal line SL2 in a direction from the second subpixel P2 connected to the Nth first signal line SL1 and the (M+1)th second signal line SL2 and the second subpixel P2 connected to the (N+1)th first signal line SL1 and the Mth second signal line SL2. In this case, the second subpixel P2 connected to the Nth first signal line SL1 and the Mth second signal line SL2 may have a repair algorithm different from those of the second subpixel P2 connected to the Nth first signal line SL1 and the (M+1)th second signal line SL2 and the second subpixel P2 connected to the (N+1)th first signal line SL1 and the Mth second signal line SL2, as shown in FIG. 11.

The third repair line RL3 may be disposed between the third subpixel P3 connected to the Nth first signal line SL1 and the Mth second signal line SL2 and the third subpixel P3 connected to the Nth first signal line SL1 and the (M+1)th second signal line SL2. The third repair line RL3 may be disposed in the third subpixel P3 connected to the Nth first signal line SL1 and the Mth second signal line SL2 in a second side direction, for example, a right side direction. On the other hand, the third repair line RL3 may be disposed in the third subpixel P3 connected to the Nth first signal line SL1 and the (M+1)th second signal line SL2 in a first side direction, for example, a left side direction.

For example, the third repair line RL3 may be disposed between the third subpixel P3 connected to the second one of the first signal lines SL1 and the second one of the second signal lines SL2 and the third subpixel P3 connected to the second one of the first signal lines SL1 and the third one of the second signal lines SL2.

When a defect occurs in the driving transistor, a signal of the third subpixel P3 connected to the Nth first signal line SL1 and the (M+1)th second signal line SL2 may be applied to the third subpixel P3 connected to the Nth first signal line SL1 and the Mth second signal line SL2 through the repair process.

As an example, the repair algorithm may allow a signal of Row(n) and Col(m+1) to be applied to the third subpixel P3 connected to the Nth first signal line SL1 and the Mth second signal line SL2.

Meanwhile, when a defect occurs in the driving transistor, a signal of the third subpixel P3 connected to the Nth first signal line SL1 and the Mth second signal line SL2 may be applied to the third subpixel P3 connected to the Nth first signal line SL1 and the (M+1)th second signal line SL2 through the repair process.

As an example, the repair algorithm may allow a signal of Row(n) and Col(m−1) to be applied to the third subpixel P3 connected to the Nth first signal line SL1 and the (M+1)th second signal line SL2.

Meanwhile, the third repair line RL3 may be disposed in the third subpixel P3 connected to the Nth first signal line SL1 and the Mth second signal line SL2 in the same direction as the third subpixel P3 connected to the (N+1)th first signal line SL1 and the (M+1)th second signal line SL2. In this case, the third subpixel P3 connected to the Nth first signal line SL1 and the Mth second signal line SL2 may have the same repair algorithm as that of the third subpixel P3 connected to the (N+1)th first signal line SL1 and the (M+1)th second signal line SL2, as shown in FIG. 11.

On the other hand, the first repair line RL1 may be disposed in the third subpixel P3 connected to the Nth first signal line SL1 and the Mth second signal line SL2 in a direction different from the third subpixel P3 connected to the Nth first signal line SL1 and the (M+1)th second signal line SL2 and the third subpixel P3 connected to the (N+1)th first signal line SL1 and the Mth second signal line SL2. In this case, the third subpixel P3 connected to the Nth first signal line SL1 and the Mth second signal line SL2 may have a repair algorithm different from those of the third subpixel P3 connected to the Nth first signal line SL1 and the (M+1)th second signal line SL2 and the third subpixel P3 connected to the (N+1)th first signal line SL1 and the Mth second signal line SL2.

The fourth repair line RL4 may be disposed between the fourth subpixel P4 connected to the Nth first signal line SL1 and the Mth second signal line SL2 and the fourth subpixel P4 connected to the (N−1)th first signal line SL1 and the Mth second signal line SL2. The fourth repair line RL4 may be disposed in the fourth subpixel P4 connected to the Nth first signal line SL1 and the Mth second signal line SL2 in a fourth side direction, for example, an upper side direction. On the other hand, the fourth repair line RL4 may be disposed in the fourth subpixel P4 connected to the (N−1)th first signal line SL1 and the Mth second signal line SL2 in a third side direction, for example, a lower side direction.

For example, the fourth repair line RL4 may be disposed between the fourth subpixel P4 connected to the second one of the first signal lines SL1 and the second one of the second signal lines SL2 and the fourth subpixel P4 connected to the first one of the first signal lines SL1 and the second one of the second signal lines SL2.

When a defect occurs in the driving transistor, a signal of the fourth subpixel P4 connected to the (N−1)th first signal line SL1 and the Mth second signal line SL2 may be applied to the fourth subpixel P4 connected to the Nth first signal line SL1 and the Mth second signal line SL2 through the repair process.

For example, the repair algorithm may allow a signal of Row(n−1) and Col(m) to be applied to the fourth subpixel P4 connected to the Nth first signal line SL1 and the Mth second signal line SL2.

Meanwhile, the fourth repair line RL4 The fourth subpixel P4 connected to the Nth first signal line SL1 and the Mth second signal line SL2 may be disposed in the same direction as the fourth subpixel P4 connected to the (N+1)th first signal line SL1 and the (M+1)th second signal line SL2. In this case, the fourth subpixel P4 connected to the Nth first signal line SL1 and the Mth second signal line SL2 may have the same repair algorithm as that of the fourth subpixel P4 connected to the (N+1)th first signal line SL1 and the (M+1)th second signal line SL2, as shown in FIG. 11.

On the other hand, the fourth repair line RL4 may be disposed in the fourth subpixel P4 connected to the Nth first signal line SL1 and the Mth second signal line SL2 in a direction different from the fourth subpixel P4 connected to the Nth first signal line SL1 and the (M+1)th second signal line SL2 and the fourth subpixel P4 connected to the (N+1)th first signal line SL1 and the Mth second signal line SL2. In this case, the fourth subpixel P4 connected to the Nth first signal line SL1 and the Mth second signal line SL2 may have a repair algorithm different from those of the fourth subpixel P4 connected to the Nth first signal line SL1 and the (M+1)th second signal line SL2 and the fourth subpixel P4 connected to the (N+1)th first signal line SL1 and the Mth second signal line SL2.

According to the present disclosure, the following advantageous effects may be obtained.

In the present disclosure, the repair lines are spaced apart from each other with a sufficient distance without being overlapped with each other, whereby the repair lines may be formed in a straight line without bypassing the repair contact portion. Therefore, the present disclosure may reduce or minimize the length of the repair line and reduce deterioration of light transmittance, which is caused by the repair line.

In addition, in the present disclosure, the repair lines are disposed in the non-transmissive area, whereby reduction of the transmissive area, which is caused by the repair line, may be reduced or minimized. As a result, the present disclosure may minimize deterioration of light transmittance, which is caused by the repair line.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
a first repair line extended in a first direction along a first side of a first transmissive area;
a second repair line extended in a second direction along a second side of a second transmissive area disposed to be adjacent to the first transmissive area;
a third repair line extended in the first direction along a third side facing the first side of the first transmissive area; and
a fourth repair line extended in the second direction along a fourth side facing the second side of the second transmissive area,
wherein each of the first to fourth repair lines is spaced apart from each other without being overlapped with each other.

2. The transparent display device of claim 1, further comprising:
first subpixels disposed to be adjacent to each other in the first direction with the first repair line interposed therebetween;
second subpixels disposed to be adjacent to each other in the second direction with the second repair line interposed therebetween;
third subpixels disposed to be adjacent to each other in the first direction with the third repair line interposed therebetween; and
fourth subpixels disposed to be adjacent to each other in the second direction with the fourth repair line interposed therebetween.

3. The transparent display device of claim 2, further comprising:
an anode electrode provided in each of the first, second, third and fourth subpixels; and
an anode connection electrode extended from the anode electrode to overlap any one of the first, second, third, and fourth repair lines.

4. The transparent display device of claim 3, wherein the anode connection electrode extended from the anode electrode of the first subpixel and the anode connection electrode extended from the anode electrode of the third subpixel are disposed on at least one of the second side and the fourth side provided between the first side and the third side of the first transmissive area.

5. The transparent display device of claim 3, wherein the anode connection electrode extended from the anode electrode of the second subpixel and the anode connection electrode extended from the anode electrode of the fourth subpixel are disposed on at least one of the first side and the third side provided between the second side and the fourth side of the second transmissive area.

6. The transparent display device of claim 3, wherein the anode electrode includes a first anode electrode and a second anode electrode, and the anode connection electrode includes a first anode connection portion extended from the first anode electrode, a second anode connection portion extended from the second anode electrode, a third anode connection portion coupling the first anode electrode portion with the second anode connection portion, and a fourth anode connection portion disposed to overlap any one of the first, second, third, and fourth repair lines.

7. The transparent display device of claim 6, further comprising:
a driving transistor provided in each of the first, second, third, and fourth subpixels, including an active layer, a gate electrode, a source electrode, and a drain electrode; and
a transistor connection electrode extended from the source electrode or the drain electrode and electrically coupled with the third anode connection portion through a contact hole.

8. The transparent display device of claim 3, wherein each of the first, second, third and fourth repair lines is electrically coupled with the anode connection electrode of one subpixel at one end through a repair contact portion, and is electrically disconnected from the anode connection electrode of the other subpixel at the other end with at least one insulating layer interposed therebetween.

9. The transparent display device of claim 2, further comprising:
a non-transmissive area disposed between the first transmissive area and the second transmissive area;
a plurality of first signal lines extended from the non-transmissive area in a first direction; and
a plurality of second signal lines extended from the non-transmissive area in a second direction,
wherein the first subpixel and the third subpixel are alternately disposed along the second signal line, and the second subpixel and the fourth subpixel are alternately disposed along the first signal line.

10. The transparent display device of claim 9, further comprising a black matrix provided between the transmissive area including the first transmissive area and the second transmissive area and a plurality of subpixels,
wherein at least a portion of each of the first, second, third, and fourth repair lines overlaps the black matrix.

* * * * *